May 23, 1961 H. NELSON 2,985,805

SEMICONDUCTOR DEVICES

Filed March 5, 1958 2 Sheets-Sheet 1

INVENTOR.
HERBERT NELSON
BY J. L. Whittaker
ATTORNEY

May 23, 1961 H. NELSON 2,985,805

SEMICONDUCTOR DEVICES

Filed March 5, 1958 2 Sheets-Sheet 2

INVENTOR.
HERBERT NELSON
BY J. L. Whittaker
ATTORNEY 2,985,805

SEMICONDUCTOR DEVICES

Herbert Nelson, Princeton, N.J., assignor to Radio Corporation of America, a corporation of Delaware Filed Mar. 5, 1958, Ser. No. 719,453

11 Claims. (Cl. 317—235)

Figure 1:
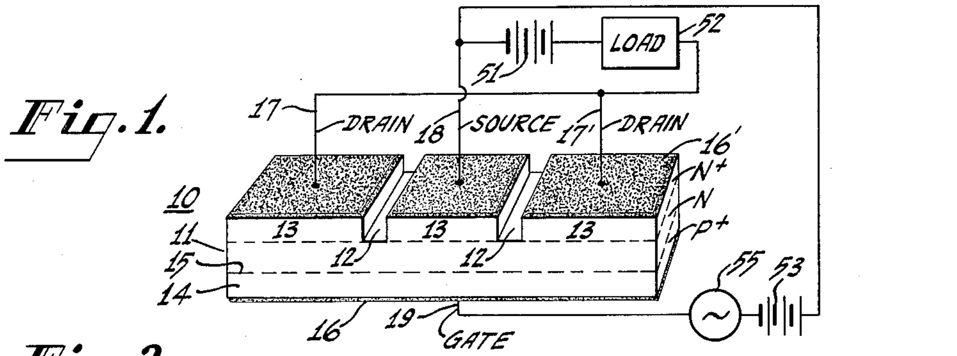

This invention relates to semiconductor devices, and more particularly to improved unipolar devices such as unipolar transistors and photo-unipolar transistors.

Semiconductor devices may be classified as bipolar and unipolar. Bipolar devices utilize both electrons and holes as charge carriers in their operation. Unipolar devices depend for their operation on charge carriers of one type only.

A typical unipolar transistor comprises a semiconductor body, such as a rod of germanium or silicon or the like, bearing a rectifying electrode between two ohmic contacts. The output current is impressed across the two ohmic contacts, one of which is known as the source and the other as the drain. The rectifying electrode which serves as the input electrode is known as the gate. In operation, the rectifying electrode is biased in the reverse direction, so as to extend a depletion layer into the semiconductor body. The input signal modulates the depth or thickness of the depletion layer. The resistivity of the semiconductor body is thereby varied by the input signal, and hence the output current is modulated by the signal current. However, it has hitherto been difficult to mass produce satisfactory unipolar devices.

Accordingly, an object of this invention is to provide improved semiconductor devices.

Another object of this invention is to provide improved unipolar transistors.

Still another object of this invention is to provide improved unipolar photosensitive devices and photo-transistors.

But another object of this invention is to provide improved unipolar devices having a structure which facilitates mass production.

These and other objects of the invention are accomplished by a typical embodiment thereof comprising a semiconductive device including a monocrystalline semiconductor body or wafer having two opposed major faces. One major face is provided with a surface zone of conductivity type opposite to that of the bulk of the wafer, so as to form a rectifying barrier at the interface of this surface zone and the wafer interior. Across the opposite face at least one groove extends and divides that face into a plurality of lands. To facilitate the connection of electrical leads to the different portions of the device, the semiconductor body is provided with electrodes consisting of a metal film on both major faces. The metal utilized is preferably one which has good electrical conductivity but does not affect the conductivity type of the semiconductor body. In operation, one or more of the lands serve as the source, the remaining lands serve as the drain, and the opposite face with its rectifying barrier serves as the gate electrode. The conducting channel between the lands is the interior portion of the body or wafer between the groove bottoms and the PN junction. A power supply and a load circuit are connected between the source and drain. A signal generator is connected to the gate electrode so as to modulate, by controlling the penetration of the depletion layer into the conducting channel, the current flow between the source and drain electrodes.

In another embodiment of the invention, a portion of the metal film adjacent the rectifying barrier on the wafer face opposite the grooved face is removed, and the exposed semiconductor area is processed so as to increase the photosensitive area of the device, whereby the current flow from the source to the drain is modulated in accordance with the magnitude of incident radiation.

Figure 3:
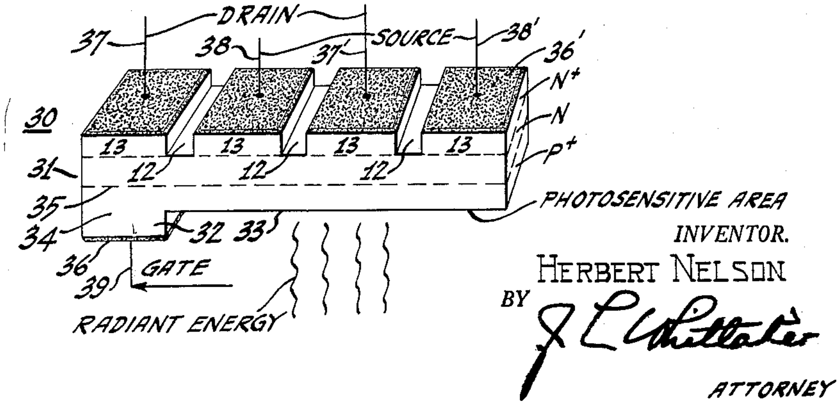
Figure 4A:
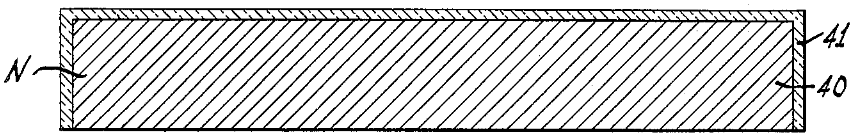
Figure 4B:
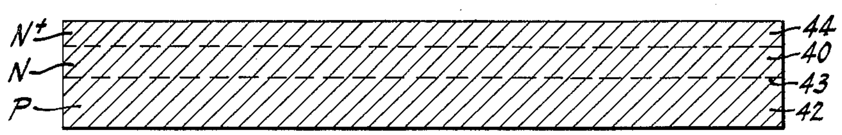
Figure 4C:
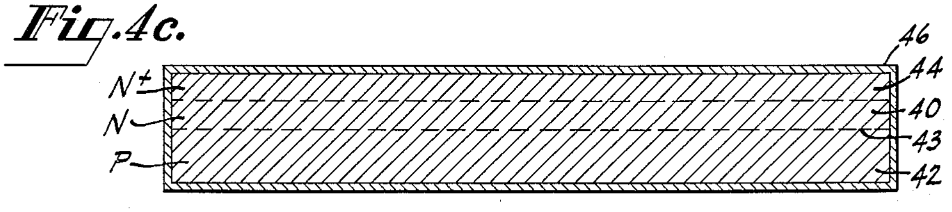
Figure 4D:
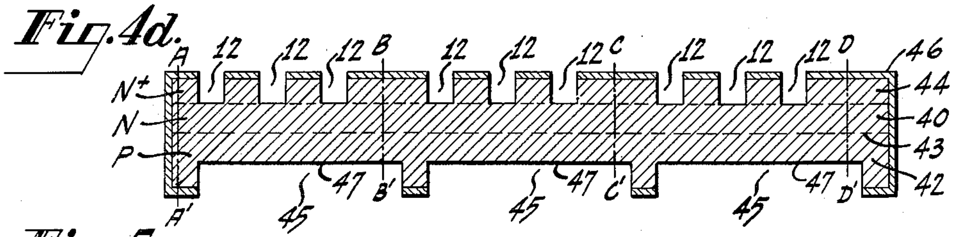
Figure 5:
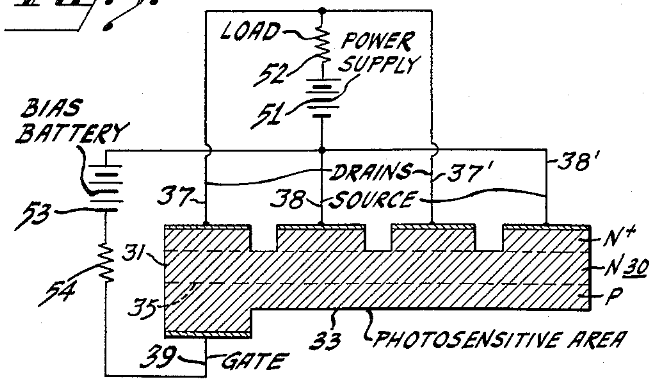

The invention is described in greater detail with reference to the accompanying drawing, in which:

Figure 1 is a perspective view of a first device embodying the principles of the invention;

Figures 2*a*–2*d* are sectional elevational views illustrating successive steps in the fabrication of the device shown in Figure 1;

Figure 3 is a perspective view of a second unipolar device in accordance with the principles of the invention;

Figures 4*a*–4*d* are sectional elevational views illustrating successive steps in the fabrication of the device shown in Figure 3; and Figure 5 is a schematic view of the device of Figure 3 with associated circuit for operation as combined photocell and amplifier.

Referring to Figure 1, a first embodiment of the invention comprises a device 10 including a body 11 of a given conductivity type monocrystalline semiconductor such as germanium or indium phosphide or the like. A major face of the body 11 is provided with one or more spaced grooves 12 which form lands 13 on the wafer face. In this example, two grooves are provided, thus forming three lands. The lands 13 are of the same conductivity type as the semiconductor body 11, but preferably of greater conductivity. If the body 11 is P-type, the lands 13 may be designated as P+, and conversely if the body 11 is N-type, the lands 13 are preferably N+ type.

The opposite major face bears a surface zone 14 of conductivity type opposite to that of the original body. The surface zone 14 is preferably of higher conductivity than the original body 11. At the interface between the surface zone 14 and the interior zone of the body there is formed a rectifying barrier 15. Over the opposite major face a metal coating or film 16 is deposited. A similar metal film 16' is deposited on the uppermost surface of the lands 13. The metal film is utilized as the electrodes of the device, and hence the metal selected is one which will provide high electrical conductivity to the underlying semiconductor without affecting the conductivity type of the semiconductive body. For example, when silicon is utilized as the semiconductor, a suitable metal is nickel or rhodium. To complete the device, leads 17, 17', and 18 are attached to the metal film 16' on each land. Lead wire 19 is similarly attached, for example by soldering, to the metal film 16 on the opposite face, which serves as the gate electrode. The wire leads may for example be nickel, copper, or a noble metal.

One or more of the lands 13 are electrically connected as the source, while the remaining land or lands are connected as the drain. In this example, the central land serves as the source, while the remaining lands act as the drains. In the operation of a device having an N-type channel and a P-type gate region, the negative terminal of a suitable power supply such as a battery 51 is connected to the source lead 18. The positive terminal of the battery is connected to the load circuit 52, which in turn is connected to the drain leads 17 and 17' of the device. The gate lead 19 is connected to a signal generator 55 and to the negative terminal of a bias battery. 53. The positive terminal of the bias battery 53 is connected to the source lead 18. The above polarities are reversed for a device having a P-type channel and an N-type gate.

During the operation of the device 10, a current of electrons is injected into the semiconductor body 11 at the source electrode 18. The current flows through the channel or central zone of the semiconductor body 11 to the drain electrodes 17 and 17', which are electrically connected. The gate electrode 19, by means of the bias voltage and signal voltage applied thereto, forms a depletion layer which extends from the rectifying barrier 15 into the central zone or channel of the device, thereby modulating the resistivity of the conducting channel so as to control the current flowing between the source 18 and the drain electrodes 17 and 17'.

The device 10 may for example be fabricated from a body 11 of N-type silicon by converting a surface zone 14 at one major face of the body to P-type, thereby forming a rectifying barrier 15 at the boundary between the P and N portions of the body. The acceptor impurity may for example be boron, aluminum, gallium, or indium. Next the body is plated with a nickel film, which advantageously is sintered to the silicon so as to provide a low resistivity contact. Thereafter the grooves 12 may be formed in the other major face of the body 11 by means of diamond grinding wheels, or by an etching process.

Alternatively, the device may be conveniently mass-produced by the following method, utilizing techniques described in application Serial No. 648,855, filed March 27, 1957, for H. Nelson and J. Bernath, assigned to the same assignee.

Figure 2A:
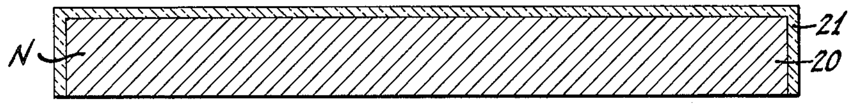

Referring to Figure 2*a* of the drawing, a wafer 20 of monocrystalline semiconductive material is prepared. In this example, the wafer 20 consists of N-type silicon of about 5 to 50 ohm-centimeter resistivity. The exact size of the wafer is not critical. In a typical example the wafer may be 1 inch long by ⅝ inch wide by 8 mils thick. The wafer 20 is heated in an atmosphere of nitrogen containing a donor impurity, which may for example be phosphorus. In this example, the nitrogen has previously been passed over phosphorus pentoxide kept at about 220° C. to 660° C. An amorphous glassy phosphorus-containing film 21 is formed over the entire wafer surface. One major wafer face is then lapped so as to remove the phosphorus-containing film 21. The lapping is continued to remove about 1 mil of silicon from this wafer face.

Figure 2B:
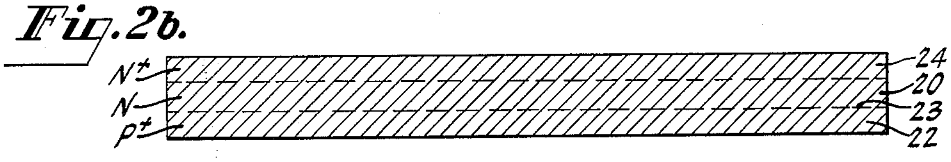

Referring to Figure 2*b* of the drawing, the wafer 20 is next heated about 3 minutes at about 1200° C. in a flowing ambient consisting of nitrogen and an acceptor impurity. In this example, the ambient consists of 300 volumes nitrogen and 1 volume boron trichloride. Some boron trichloride reacts with the exposed silicon and forms a boron-containing film on the major wafer face previously exposed by lapping. The opposite wafer face is protected by the phosphorus-containing film from the attack of the boron trichloride.

The ambient is then changed to pure nitrogen, and the wafer is heated for about 15 hours at about 1300° C. to diffuse the donor and the acceptor into opposite wafer faces. The boron on the exposed wafer face diffuses into the wafer 20 during the heating, and forms a thin layer 22 of $P^+$-conductivity type over the one major face. Under these conditions, the P-type surface layer is about 2.8 mils thick. A PN junction 23 is formed at the interface between the $P^+$-type layer 22 and the central N-type bulk of the wafer 20. At the same time phosphorus diffuses into the opposite wafer face to form an $N^+$ layer 24 which is also about 2.8 mils thick. The phosphorus-containing film still remaining on the wafer surface is then removed by treatment with hydrofluoric acid, leaving the N-type wafer 20 with an $N^+$ layer 24 on one major face and a $P^+$ layer 22 on the opposite major face.

Figure 2C:
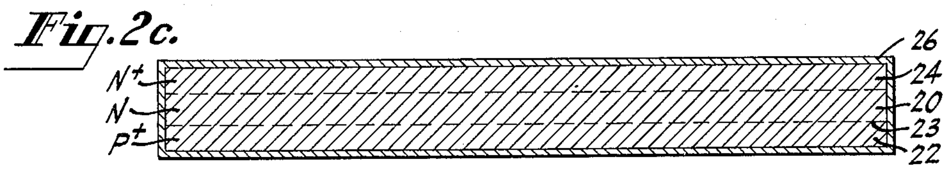

Referring to Figure 2*c*, the entire wafer surface is cleaned by brushing with abrasive powder and washing in distilled water before covering the wafer with a coating or film 26 of a metal that makes a good non-rectifying contact to the wafer but does not affect the conductivity type of the particular semiconductor utilized. The metal film 26 serves as the electrode to the different regions of the completed device, and facilitates the fabrication of good electrical connections thereto. In this example, a suitable metal is nickel. An adherent nickel plating may be deposited on the surface of the silicon by the electroless nickel plating technique described by A. Brenner in "Metal Finishing 52," No. 11, 68 (1954).

Figure 2D:
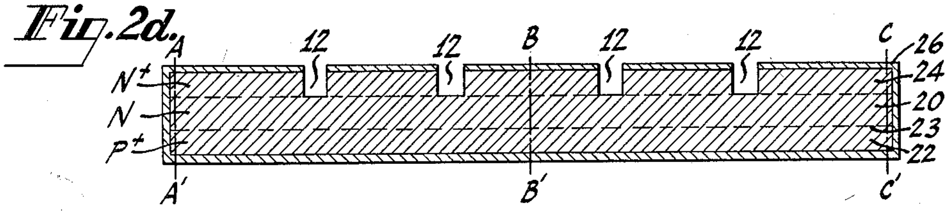

Referring to Figure 2*d*, the wafer is again lapped to form a series of grooves or channels 12 across the $N^+$ major wafer face. The grooves 12 extend through the nickel surface film 26 and the $N^+$ surface layer 24 to the conducting channel or central N-type region of the wafer, and are made sufficiently deep so that the distance from the bottom of the groove to the PN junction 23 is about 0.5 mil. In this example, the grooves 12 are about 4 mils wide and 3.7 mils deep. The distance between grooves is alternately 30 mils and 80 mils. The wafer is then cut along planes such as AA', BB' and CC' which are parallel to the grooves 12. Cuts are made midway between those grooves which are 80 mils apart, and adjacent the ends of the wafer. Thereafter the wafer is diced along planes perpendicular to the grooves to form units as shown in Figure 1.

Unipolar transistors thus prepared from N-type silicon having a resistivity of about 21 ohm-centimeters exhibited transconductances in the neighborhood of 500 μmhos. At a gate bias of −4 volts and a drain bias of 10 volts, one representative unit shows a transconductance of 460 μmhos, a drain resistance of 3200 ohms, and a gate-to-channel capacity of 96 μμ farads.

Referring to Figure 3, another embodiment of the invention particularly useful as a photo-transistor comprises a device 30 including a body 31 of a given conductivity type monocrystalline semiconductor such as gallium arsenide or germanium or the like. A major face of the body 31 is provided with one or more spaced grooves 12 which form lands 13 on the wafer face. In this example, three grooves are provided, forming four lands. The lands 13 are also of given conductivity type, but preferably of greater conductivity than the body 31.

The opposite major face of the semiconductor body 31 bears a surface zone 34 of conductivity type opposite to that of the original body. At the interface between the surface zone 34 and the interior of the body 31 there is formed a rectifying barrier 35. A portion 32 of the opposite major face is covered with a metal coating or film 36. The coated portion 32 of the semiconductor body 31 is thicker than the remainder of the body and thus adds some rigidity to the structure. The adjacent exposed portion 33 of the opposite face serves as the photosensitive area of the device. A similar metal film 36' is deposited on the uppermost surface of the lands 13. The metal film is utilized as the electrodes of the device, and hence the metal selected is one which will provide electrical conductivity without affecting the conductivity type of the semiconductive body. For example, when germanium is utilized as the semiconductor, a suitable metal for this purpose is rhodium. To complete the device, leads 37, 38, 37' and 38' are attached to the metal film 36' on each land. Lead wire 39 is similarly attached, for example by soldering, to the metal film 36 which covers a portion of the opposite face. The wire leads may for example be tungsten or nickel or a noble metal.

One pair of alternate lands are electrically connected by leads 37 and 37' to serve as the drain. The other pair of lands are connected by means of leads 38 and 38' to serve as the source. In the operation of a device having an N-type channel and a P-type gate, the negative terminal of a suitable power supply such as a battery is connected to source leads 38 and 38'. The positive battery terminal is connected to the load circuit, which in turn is connected to the drain leads 37 and 37' of the device. The gate lead 39 is connected to the negative terminal of a bias battery. The positive terminal of the battery is connected to the source. The above polarities are reversed for devices having a P-type channel and an N-type gate.

During the operation of the photo-unipolar device 30, a current of electrons is injected into the semiconductor body 31 by means of the source electrodes 38 and 38', while a radiant energy signal, for example a ray of light of variable intensity, is directed against the photo-sensitive area 33. The electron current flows through the central N-type channel of semiconductor body 31 to the drain electrodes 37 and 37'. The bias voltage applied to the gate electrode 39 forms a depletion layer which extends from the rectifying barrier 35 into the central zone or channel of the device. The depletion layer increases the resistivity of the central zone of the device. The channel resistivity is thus modulated by the intensity of the incident radiation.

The photo-sensitive device 30 may for example be fabricated from a body 31 of N-type silicon by converting a surface zone 34 of the body to P-type, thereby forming a rectifying barrier 35 at the boundary or interface between the P and N portions of the body. The grooves 12 may be formed in one face of the body 31 by masking selected portions of the surface and then etching. Alternatively, the device 30 may be mass-produced by the following method, utilizing processing steps similar to those described above for fabricating the unipolar transistor of Figure 1.

Referring to Figure 4*a* of the drawing, a body or wafer 40 of monocrystalline semiconductive material is prepared. In this example, the wafer 40 consists of N-type silicon of about 20 ohm-centimeter resistivity. The exact size of the wafer is not critical. The larger the wafer, the more units can be prepared in a single operation. The wafer is heated in vapors of a donor impurity, which may for example be phosphorus as described above in connection with Figure 2*a*. A glassy phosphorus-containing film 41 is formed over the wafer 40. One major wafer face is then lapped to remove the phosphorus-containing film 41.

Referring to Figure 4*b*, the wafer 40 is then heated to about 1200° C. in an ambient containing vapors of boron trichloride, as described above. The wafer is then heated for about 15 hours at about 1300° C. in a nitrogen ambient so as to diffuse the donor and acceptor impurities into opposite wafer faces. The boron on the exposed surface diffuses into the wafer 40 during the heating, and forms a thin layer 42 of P-type conductivity over the one major wafer face. Under these conditions, the P-type surface layer is about 2.8 mils thick. A PN junction 43 is formed at the interface between the P-type layer 42 and the N-type bulk of the wafer. During the same heating step phosphorus diffuses from the glassy phosphorus-containing film 41 into the opposite wafer face to form an $N^+$ layer 44. The remainder of the phosphorus-containing film 41 is then removed by washing with hydrofluoric acid, leaving the wafer as shown with an $N^+$ layer adjacent one major face, a P-type layer adjacent the opposite major face, and a central N-type portion.

Referring to Figure 4*c*, the surface of wafer 40 is cleaned for example by brushing with an abrasive and washing in deionized water. A metal film 46 is then deposited on the wafer surface. The metal selected is one which makes a good ohmic contact to the wafer and does not affect the conductivity type of the semiconductor utilized. In this example, a suitable metal is nickel, which may be deposited by the electroless plating technique previously mentioned.

Referring to Figure 4*d*, the wafer 40 is again lapped to form sets of grooves 12 across the $N^+$ wafer face. Each set in this example consists of 3 grooves spaced 30 mils apart, while the distance between each set is 60 mils. The grooves 12 extend through the nickel surface film 46 to the N-type central region of the wafer, and are made sufficiently deep so that the distance from the bottom of each groove to the PN junction 43 is about 0.5 mil. In this example, the grooves 12 are about 6 mils wide and 3.7 mils deep.

The opposite P-type wafer face is lapped to form a series of broad shallow grooves 45, thus removing portions of the nickel film 46 and exposing photo-sensitive areas 47 of the silicon body. To expose a fresh crystallographically undisturbed surface on the photo-sensitive areas 47, advantageously the wafer is lightly etched with hot 1% sodium hydroxide solution. The decreased separation between the bottom of grooves 45 and the PN junction 43 enhances the efficiency of the resulting devices by reducing the recombination of electron-hole pairs. In this example, the grooves 45 are about 1 mil deep and 115 mils wide. The wafer 40 is then cut along planes AA', BB', CC' and DD' parallel to the groove, and diced along planes perpendicular to the grooves to form units as shown in Figure 3.

Referring to Figure 5, a photo-unipolar device as in Figure 3 can be operated in the circuit illustrated so as to combine the functions of a photocell and a triode in a single unit. Source leads 38 and 38' of the photo-unipolar device 30 are connected to the negative terminal of a suitable power supply, such as a battery 51. The positive terminal of the battery 51 is connected to the load 52, which in turn is connected to the drain leads 37 and 37'. The gate lead 39 is attached to the negative terminal of a bias battery 53 by means of a large fixed series resistance 54 which is of the order of magnitude of one megohm. The positive terminal of bias battery 53 is connected to the source leads 38 and 38'.

In the operation of the device 30 in the circuit shown, a beam of radiant energy, such as a ray of light of variable intensity, is directed against the photo-sensitive area 33 of the device. The energy of the impinging radiation quanta or photons is absorbed by the semiconductor body 31. When the energy of the absorbed photon is sufficient to disrupt a covalent bond, an electron-hole pair is formed. The number of available charge carriers is thereby increased since a free electron and a free hole are created for each covalent bond disrupted. The electrons and holes tend to recombine, but since the distance from the surface region where radiation photons are absorbed to the rectifying barrier 35 is small, most of the charge carriers are separated by the PN junction 35 before they can recombine. The electrons drift across the barrier 35 into the N-type region, and cause an increase in the flow of current through the external circuit which includes the resistor 54. The resultant increase in the voltage drop across the resistor 54 causes a lowered gate bias which in turn leads to an increase in the current which flows from source to drain. The device thus combines the functions of a photocell and a triode in a single unit.

Photo-unipolar transistors with grooves 80 mils long and 6 mils wide were prepared from N-type silicon having a resistivity of about 20 to 30 ohm-centimeters. In a representative unit, the photo-sensitive boron-doped region opposite the grooves is approximately 70 mils by 180 mils in area and 7 mils thick. Measurements on a representative unit showed a gate-to-channel capacity of 140 $\mu\mu$farads, a transconductance of 500 $\mu$mhos, and an $I_d$ or dark current of $7\times10^{-3}$ amperes at a gate bias of $-4$ volts and a drain bias of 10 volts. Representative devices showed a D.C. photo-response of about 2 to 20 amperes per lumen. An amplified photo-response of 3 amperes per lumen was obtained in the circuit illustrated when a two megohm resistor 54 was connected in series with the gate bias battery 53. The combination of low impedance and high output current makes these devices suitable for applications where a high multiplication ratio is required, such as auto headlight dimmers.

It will be understood that the invention can be practiced with all the conventional monocrystalline semiconductive materials, including compounds such as indium phosphide and gallium arsenide. The semiconductor choice depends on the particular application. For example, gallium arsenide has a greater energy gap than silicon, and hence a lower reverse current. The mobility of electrons in gallium arsenide is greater than that in silicon, hence the output current of gallium arsenide unipolar devices will be larger than the output of silicon devices by a factor of about 5.

It will also be understood that the conductivity types of the various zones of the illustrated devices may be reversed, provided that the polarity of the applied bias voltages is similarly reversed as required.

There have thus been described new and useful forms of semiconductor devices, as well as methods for making these devices.

What is claimed is:

1. An electrical device comprising a monocrystalline given conductivity type semiconductor body having two opposed major faces, one said major face bearing at least one groove across said face and a plurality of lands, all of said lands having throughout a conductivity greater than the conductivity of said body, the opposite major face having a surface zone of opposite conductivity type so as to form a rectifying barrier at the interface between said surface zone and the interior zone of said body, and a non-rectifying metal film on said lands and on at least a portion of said opposite major face.

2. An electrical device comprising a monocrystalline given conductivity type semiconductor body having two opposed major faces, one said major face bearing at least one groove across said face and a plurality of lands, all of said lands having throughout a conductivity greater than the conductivity of said body, the opposite major face having a surface zone of opposite conductivity type and a rectifying barrier at the interface between said surface zone and the interior zone of said body, and a metal film on said lands and on at least a portion of said opposite major face, said metal being electrically conductive but not affecting the conductivity type of said semiconductor.

3. A unipolar transistor comprising a monocrystalline given conductivity type silicon body having two opposed major faces, one of said major faces bearing at least one groove across said face and a plurality of lands, all of said lands having throughout a conductivity greater than the conductivity of said body, the opposite major face having a surface zone of opposite conductivity type and a rectifying barrier at the interface between said surface zone and said interior zone, a non-rectifying metal film on said lands and over the entire opposite major face, and leads attached to said metal film on each said land and on said opposite face.

4. A unipolar transistor comprising a monocrystalline given conductivity type silicon body having two opposed major faces, one said major face bearing at least one groove across said face and a plurality of lands, all of said lands having throughout a conductivity greater than the conductivity of said body, the opposite major face face having a surface zone of opposite conductivity type and a rectifying barrier at the interface between said surface zone and said interior zone, a metal film on said lands and over the entire opposite major face, said metal being electrically conductive but not affecting the conductivity type of said semiconductor, and leads attached to said metal film on each said land and on said opposite face.

5. A unipolar transistor comprising a monocrystalline given conductivity type silicon body having two opposed major faces, one said major face bearing at least one groove across said face and a plurality of lands, all of said lands having throughout a conductivity greater than the conductivity of said body, the opposite major face having a surface zone of opposite conductivity type and a rectifying barrier at the interface between said surface zone and said interior zone, a nickel film on said lands and over the entire opposite major face, said film being electrically conductive but not affecting the conductivity type of said semiconductor, and leads attached to said metal film on each said land and on said opposite face.

6. A unipolar transistor comprising a monocrystalline N-conductivity type semiconductor body having two opposed major faces, one said major face bearing at least one groove across said face and a plurality of lands, all of said lands having throughout a conductivity greater than the conductivity of said body, the opposite major face having a surface zone of P-conductivity type, a PN junction at the interface between said P-type surface zone and the N-type bulk of said body, the distance between said PN junction and the bottom of said groove being less than one mil, a metal film on said lands and over the entire opposite major face, said film being electrically conductive but not affecting the conductivity type of said semiconductor, and leads attached to said metal film on each said land and on said opposite face.

7. A photo-unipolar transistor comprising a monocrystalline given conductivity type silicon body having two opposed major faces, one said major face bearing at least one groove and a plurality of lands across said face, all of said lands having throughout a conductivity greater than the conductivity of said body, the opposite major face having a surface zone of opposite conductivity type, a rectifying barrier at the interface between said surface zone and the interior zone of said body, a non-rectifying metal film on said lands and on a portion of said opposite major face, and leads attached to said metal film on each said land and on said portion of said opposite face.

8. A photo-unipolar transistor comprising a monocrystalline given conductivity type silicon body having two opposed major faces, one said major face bearing at least one groove and a plurality of lands across said face, all of said lands having throughout a conductivity greater than the conductivity of said body, the opposite major face having a surface zone of opposite conductivity type, a rectifying barrier at the interface between said surface zone and the interior zone of said body, a metal film on said lands and on a portion of said opposite major face, said metal being electrically conductive but not affecting the conductivity type of said semiconductor, and leads attached to said metal film on each said land and on said portion of said opposite face.

9. A photo-unipolar transistor comprising a monocrystalline given conductivity type silicon body having two opposed major faces, one said major face bearing at least one groove across said face and a plurality of lands, all of said lands having throughout a conductivity greater than the conductivity of said body, the opposite major face having a surface zone of opposite conductivity type, a rectifying barrier at the interface between said surface zone and the interior zone of said body, the distance between said rectifying barrier and the bottom of said groove being less than one mil, a metal film on said lands and on a portion of said opposite major face, said metal being electrically conductive but not affecting the conductivity type of said semiconductor, the region of said wafer between said opposite metal films being thicker than the remainder of said wafer, and leads attached to said metal film on each said land and on said portion of said opposite face.

10. A photo-unipolar transistor comprising a monocrystalline given conductivity type silicon body having two opposed major faces, one said major face bearing at least one groove across said face and a plurality of lands, all of said lands having throughout a conductivity greater than the conductivity of said body, the opposite major face having a surface zone of opposite conductivity type, a rectifying barrier at the interface between said surface zone and the interior zone of said body, the distance between said rectifying barrier and the bottom of said groove being less than one mil, a nickel film on said lands and on a portion of said opposite major face, said film being electrically conductive but not affecting the conductivity type of said semiconductor, the region of said wafer between said opposite nickel films being thicker than the remainder of said wafer, and leads attached to said nickel film on each said land and on said portion of said opposite face.

11. A photo-unipolar transistor comprising a monocrystalline N-conductivity type silicon body having two opposed major faces, one said major face bearing at least one groove across said face and a plurality of lands, all of said lands having throughout a conductivity greater than the conductivity of said body, the opposite major face having a surface zone of P-conductivity type, a PN junction at the interface between said surface zone and the interior zone of said body, the distance between said rectifying barrier and the bottom of said groove being less than one mil, a nickel film on said lands and on a portion of said opposite major face, said film being electrically conductive but not affecting the conductivity type of said semiconductor, the region of said wafer between said opposite nickel films being thicker than the remainder of said wafer, and leads attached to said nickel film on each said land and on said portion of said opposite face.

References Cited in the file of this patent

UNITED STATES PATENTS

| | | |
|---|---|---|
| 2,663,806 | Darlington | Dec. 22, 1953 |
| 2,748,041 | Leverenz | May 29, 1956 |
| 2,820,154 | Kurshan | Jan. 14, 1958 |
| 2,831,787 | Emeis | Apr. 22, 1958 |
| 2,837,704 | Emeis | June 3, 1958 |